US007916571B2

(12) United States Patent
Tessitore

(10) Patent No.: US 7,916,571 B2
(45) Date of Patent: Mar. 29, 2011

(54) APPARATUS FOR IMPLEMENTING MULTIPLE INTEGRATED CIRCUITS USING DIFFERENT GATE OXIDE THICKNESSES ON A SINGLE INTEGRATED CIRCUIT DIE

(75) Inventor: Ronald John Tessitore, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 210 days.

(21) Appl. No.: 12/124,393

(22) Filed: May 21, 2008

(65) Prior Publication Data

US 2009/0289323 A1 Nov. 26, 2009

(51) Int. Cl.
   *G11C 8/00* (2006.01)
(52) U.S. Cl. ............... 365/230.03; 257/499; 257/506; 365/227; 365/185.11
(58) Field of Classification Search ............ 257/499, 257/506, E27.001; 365/227, 185.11, 230.03
   See application file for complete search history.

(56) References Cited

U.S. PATENT DOCUMENTS

| 6,770,940 B2 | 8/2004 | Yamauchi |
| 6,891,210 B2 | 5/2005 | Akiyama |
| 7,248,533 B2 * | 7/2007 | Aimoto .................. 365/227 |
| 2007/0136617 A1 * | 6/2007 | Kanno et al. ........... 713/320 |

OTHER PUBLICATIONS

International Search Report—PCT/US09/043342, International Search Authority—European Patent Office—Jul. 27, 2009.
Written Opinion—PCT/US09/043342, International Search Authority—European Patent Office—Jul. 27, 2009.
G.C-F Yeap, F. Nkansah, J. Chen, S. Jallepalli, D. Pham, T. Lii, A. Nangia, P.Le, D. Hall, D. Menke, J. Sun, A. Das, P. Gilbert, F. Huang, J. Sturtevant, K. Green, J. Lu, J. Benavidas, E. Banks, J. Chung, and C. Lage; A 180nm Copper/Low-k CMOS Technology with Dual Gate Oxide Optimized for Low Power and Low Cost Consumer Wireless Applications; 2000 Symposium on VLSI Technology Digest of Technical Papers; pp. 150-151; 2000 IEEE.

* cited by examiner

*Primary Examiner* — Tan N Tran
(74) *Attorney, Agent, or Firm* — Nicholas J. Pauley; Jonathan T. Velasco; Tim Loomis

(57) ABSTRACT

An apparatus comprising plurality of functional integrated circuit blocks, each manufactured with different oxide thicknesses on a monolithic integrated circuit die, is described. Using different gate oxide thicknesses for different functional integrated circuit blocks provides reduced power consumption and increases performance in processing systems. Several embodiments comprising different combinations of functional integrated circuit blocks, including processor cores and memory elements, are presented.

11 Claims, 5 Drawing Sheets

APPARATUS FOR IMPLEMENTING MULTIPLE INTEGRATED CIRCUITS USING DIFFERENT GATE OXIDE THICKNESSES ON A SINGLE INTEGRATED CIRCUIT DIE

FIELD OF DISCLOSURE

The present disclosure relates generally to monolithic integrated circuit dies, and more particularly to ways of grouping blocks of integrated circuits, each of such integrated circuit blocks being made up of transistors having different gate oxide thicknesses, on a monolithic integrated circuit die.

BACKGROUND

Conventionally, monolithic integrated circuit dies can be manufactured with two transistor gate oxide thicknesses. A thick gate oxide is commonly used for transistors in circuits for input to and output from an integrated circuit die (I/O devices) and a thinner gate oxide is used for all other transistors on the die (functional devices). Although it is possible to select between varying thicknesses for the thinner gate oxide layer depending on the desired performance and power characteristics of the circuit to be implemented, until recently functional devices were commonly limited to a single gate oxide thickness. For example, thinner gate oxides enable higher frequency operation and hence higher performance at a cost of higher leakage current. Thicker gate oxides provide lower leakage current but sacrifice higher frequency operation. With the advent of triple gate oxide (TGO) manufacturing processes, it is now possible to have three transistor gate oxide thicknesses with varying performance characteristics on a monolithic integrated circuit die. Accordingly, there is a need in the art to utilize the TGO process to produce integrated circuits in order to advantageously utilize the varying performance characteristics enabled by the TGO process.

Gate oxide thickness is commonly described in "equivalent physical oxide thickness" terms because current processes do not necessarily use pure silicon to create the gate oxide. Some processes employ a dielectric which has a higher dielectric constant than silicon. Such processes report the thickness of pure silicon required to achieve equivalent capacitance with the dielectric actually used. In current processes, equivalent physical oxide thicknesses can commonly vary between approximately 3-6 nm for I/O devices and between approximately 1-2 nm for functional devices. FIG. 1 illustrates a cross-sectional view of a conventional CMOS transistor, and in particular the location of the gate oxide. Herein all references to gate oxide thickness also apply to equivalent physical oxide thickness.

Integrated circuits (ICs) are generally thought of as being composed of interoperable blocks or functional units (sometimes called cores) of circuitry which perform some particular function and cooperate in order to function as a complete IC. For example, processors or processor cores are integrated circuits designed to perform a particular set of computational functions. A common method of achieving greater computational performance in an IC is to employ a plurality of processor cores. The processor cores in such a multiple-core systems may be identical or may have differing architectures, power consumption and performance capabilities that make them suitable for particular kinds of tasks. Examples of combinations include but are not limited to: (1) identical processors operated at differing voltages and frequencies; (2) processors which are designed with different sets of functions (for example, one fast processor with an comprehensive instruction set and one slow but power-efficient processor with a reduced instruction set); and (3) identical processors manufactured with different processes leading to different performance and power characteristics.

SUMMARY OF THE DISCLOSURE

The present disclosure teaches that a TGO manufacturing process may permit advantageous grouping and arrangement of integrated circuit blocks having different types of functional devices fabricated with differing gate oxide thicknesses on a monolithic integrated circuit die. A block of this type will be referred to herein as a functional integrated circuit block, and is defined as an integrated circuit block whose composition includes functional devices and excludes I/O devices. These functional integrated circuit blocks may have differing performance and power characteristics that lend themselves to different uses.

In one embodiment, a processor core and coupled L2 cache memory are manufactured on a single integrated circuit die. The functional devices of a processor core and a portion of the L2 cache memory are manufactured with a first gate oxide thickness and the functional devices of the other portion of the L2 cache memory are manufactured with a second gate oxide thickness. For example, the L2 cache memory may be manufactured such that the memory array cells have a thicker gate oxide and the logic functions have a thinner gate oxide. This will reduce leakage current in the memory array while retaining the performance advantage of the thinner gate oxide for the logic functions.

In another embodiment, the functional devices of a first processor core are manufactured with a first gate oxide thickness. On the same integrated circuit die, a second processor core and a common L2 cache memory are manufactured with a second gate oxide thickness. The two processor cores are coupled to each other and both are coupled to the common L2 cache memory. Tasks are distributed to each processor core by a task control block which is responsive to a control program.

In a further embodiment, two functionally identical processing units are manufactured on the same integrated circuit die. Each processing unit is made up of two processor cores coupled to each other and a common L2 cache memory coupled to both processor cores. The two processing units are coupled to each other through a system bus. The first processing unit is manufactured with a first gate oxide thickness and the second processing unit is manufactured with a second gate oxide thickness. Tasks are distributed to each processing unit by a task control block which is responsive to a control program.

The above-described embodiments provide several advantages. Implementing otherwise identical processor cores with functional devices with different gate oxide thicknesses on a monolithic integrated circuit die may realize the performance advantages of a multiple processor core system while minimizing the disadvantages caused by the use of off-chip interconnect and interface circuitry between multiple processor cores having different characteristics due to differing gate oxide thicknesses. Such an implementation may reduce power consumption and heat generation by allowing tasks to run on a processor core which consumes the least amount of power given the performance requirements of a particular task. Such an implementation may also improve processing throughput by using functional integrated circuit blocks capable of higher frequency operation.

It is understood that other embodiments of the teachings herein will become apparent to those skilled in the art from the following detailed description, wherein various embodiments of the teachings are shown and described by way of illustration but not limitation. As will be realized, the teachings herein are capable of other and different embodiments without departing from the spirit and scope of the teachings herein. Accordingly, the drawings and detailed description are to be regarded as illustrative in nature and not as restrictive.

BRIEF DESCRIPTION OF THE DRAWINGS

Various aspects of the teachings of the present disclosure are illustrated by way of example, and not by way of limitation, in the accompanying drawings, wherein.

DETAILED DESCRIPTION

The detailed description set forth below, in connection with the appended drawings, is intended as a description of various exemplary embodiments of the teachings of the present disclosure and is not intended to represent the only embodiments in which such teachings may be practiced. The detailed description includes specific details for the purpose of providing a thorough understanding of the teachings by way of illustration and not limitation. It will be apparent to those skilled in the art that the teachings of the present disclosure may be practiced in a variety of ways. In some instances, well known structures and components are shown in block diagram form in order to avoid obscuring the concepts of the present disclosure.

In one or more exemplary embodiments, the functions and blocks described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Figure 1:
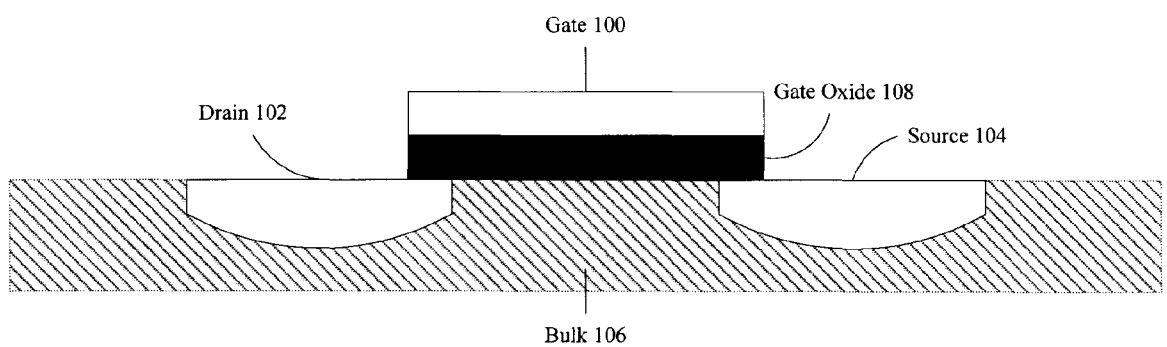
FIG. 1 is a graphical illustration of a cross-sectional view of a conventional CMOS transistor.

FIG. 1 is a graphical illustration of a cross-sectional view of a conventional CMOS transistor including a gate 100, a drain 102, a source 104 and a bulk 106 nodes. The location of a gate 102 is shown. The thickness of the gate oxide 108 varies based on the manufacturing process and the type of transistor used.

Commonly, the thickness of the gate oxide 108 is inversely related to the switching speed of the transistor. Use of a thinner dielectric material for the gate oxide 108 allows higher switching speeds. Use of a thicker dielectric material for the gate oxide 108 allows the device to withstand higher currents and voltages at the cost of lower switching speeds. I/O devices conventionally have much thicker gate oxides than functional devices. Accordingly, I/O devices are slower than functional devices and are more suitable for use in input or output circuits that require increased currents and drive larger loads. The teachings of the present disclosure are illustrated with respect to functional devices rather than I/O devices.

An exemplary TGO process retains a thick gate oxide for I/O devices and provides two different gate oxide thicknesses for functional devices. Commonly, a TGO process is more costly and subject to more manufacturing difficulties than a dual gate oxide (DGO) manufacturing process which may result in poorer yields than a DGO process.

Figure 2:
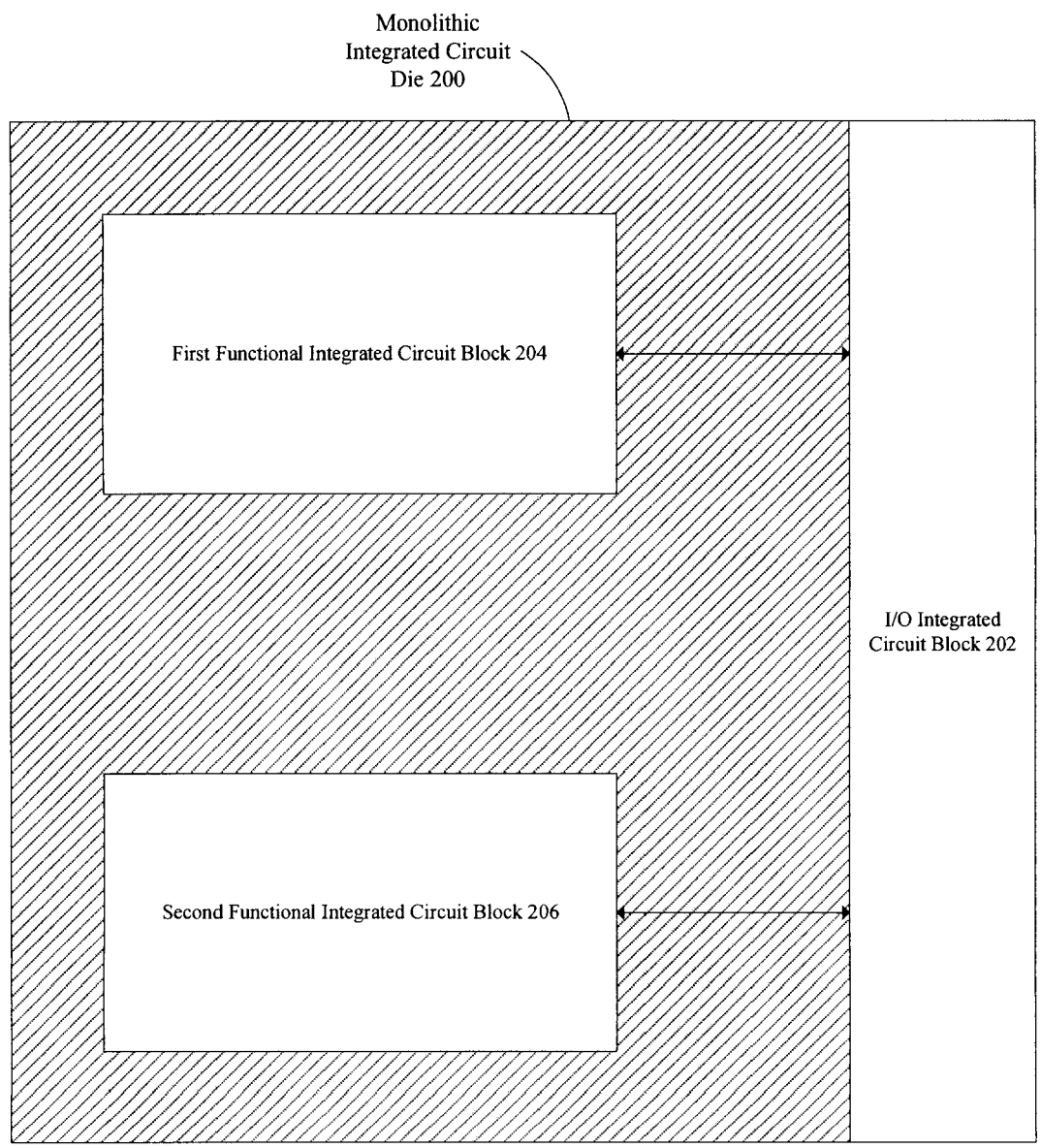
FIG. 2 is a graphical illustration of a monolithic integrated circuit die having three gate oxide thicknesses.

FIG. 2 is a graphical illustration of a monolithic integrated circuit die 200 having three gate oxide thicknesses. The monolithic integrated circuit die 200 contains an I/O integrated circuit block 202, a first functional integrated circuit block 204 and a second functional integrated circuit block 206.

The I/O integrated circuit block 202 is manufactured using I/O devices having the thickest gate oxide. This allows the I/O integrated circuit block 202 to support the higher loads and currents commonly associated with off-chip communications.

The first functional integrated circuit block 204 is manufactured using functional devices having the thinnest gate oxide. Using the thinnest gate oxide enables the first functional integrated circuit block 204 to operate at higher frequencies but also leads to higher power consumption.

The second functional integrated circuit block 206 is manufactured using functional devices having a gate oxide thicker than the functional devices used in the first functional integrated circuit block 204 but thinner than the I/O devices used in the I/O integrated circuit block 202. Using the intermediate gate oxide reduces power consumption while still enabling higher frequency operation that would be possible if the thickest gate oxide were used.

Both the first functional integrated circuit block 204 and the second functional integrated circuit block 206 are coupled to the I/O integrated circuit block 202. In another embodiment, the first functional integrated circuit block 204 and the second functional integrated circuit block 206 may be coupled to each other. Those skilled in the art will recognize that multiple interconnections between blocks are possible, and those herein are presented by way of illustration and not limitation.

Figure 3:
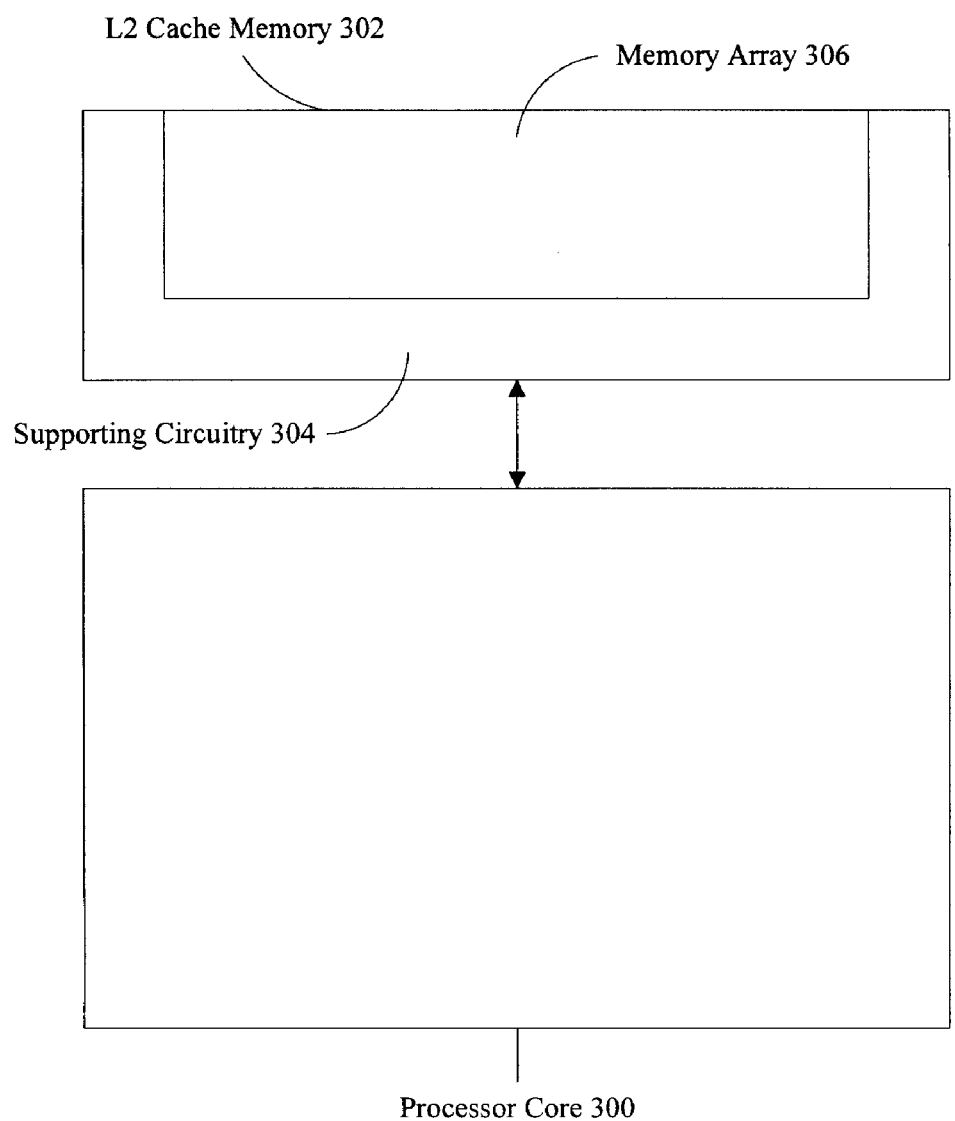
FIG. 3 is a block diagram of a processor core and an L2 cache memory manufactured using two different gate oxide thicknesses.

FIG. 3 is a block diagram of an embodiment wherein a processor core 300 is coupled with an L2 cache 302. The L2 cache 302 is further comprised of supporting circuitry 304 coupled to a memory array 306. In the presently described embodiment, the processor core 300 and the supporting circuitry 304 are manufactured with a first gate oxide thickness. The memory array 306 is manufactured with a second gate oxide thickness.

The processor core 300 and the supporting circuitry 304 manufactured with the first gate oxide thickness and the memory array 306 manufactured with the second gate oxide thickness may be operated at either the same or different voltages. If they are operated at different voltages, level shifting circuitry (not shown) may be embedded in the L2 cache 302 at the interface between the supporting circuitry 304 and the memory array 306 to allow the portions of the embodiment operating at different voltages to communicate with each other.

In this embodiment, manufacturing the memory array 304 using a thicker gate oxide takes advantage of the lower leakage current provided by the thicker gate oxide since the functional devices that make up the memory array 304 conventionally do not switch very often, and thus reducing their leakage power consumption is more important than reducing their dynamic (switching) power consumption. Manufacturing the supporting circuitry 306 using a thinner gate oxide allows quick read and write access to the L2 cache 302.

While the present embodiment is directed towards an L2 cache, those skilled in the art will realize that alternate cache hierarchies in which different cache levels are comprised of differing oxide thicknesses at each level or in which each level has more than one gate oxide thickness are also possible.

Figure 4:
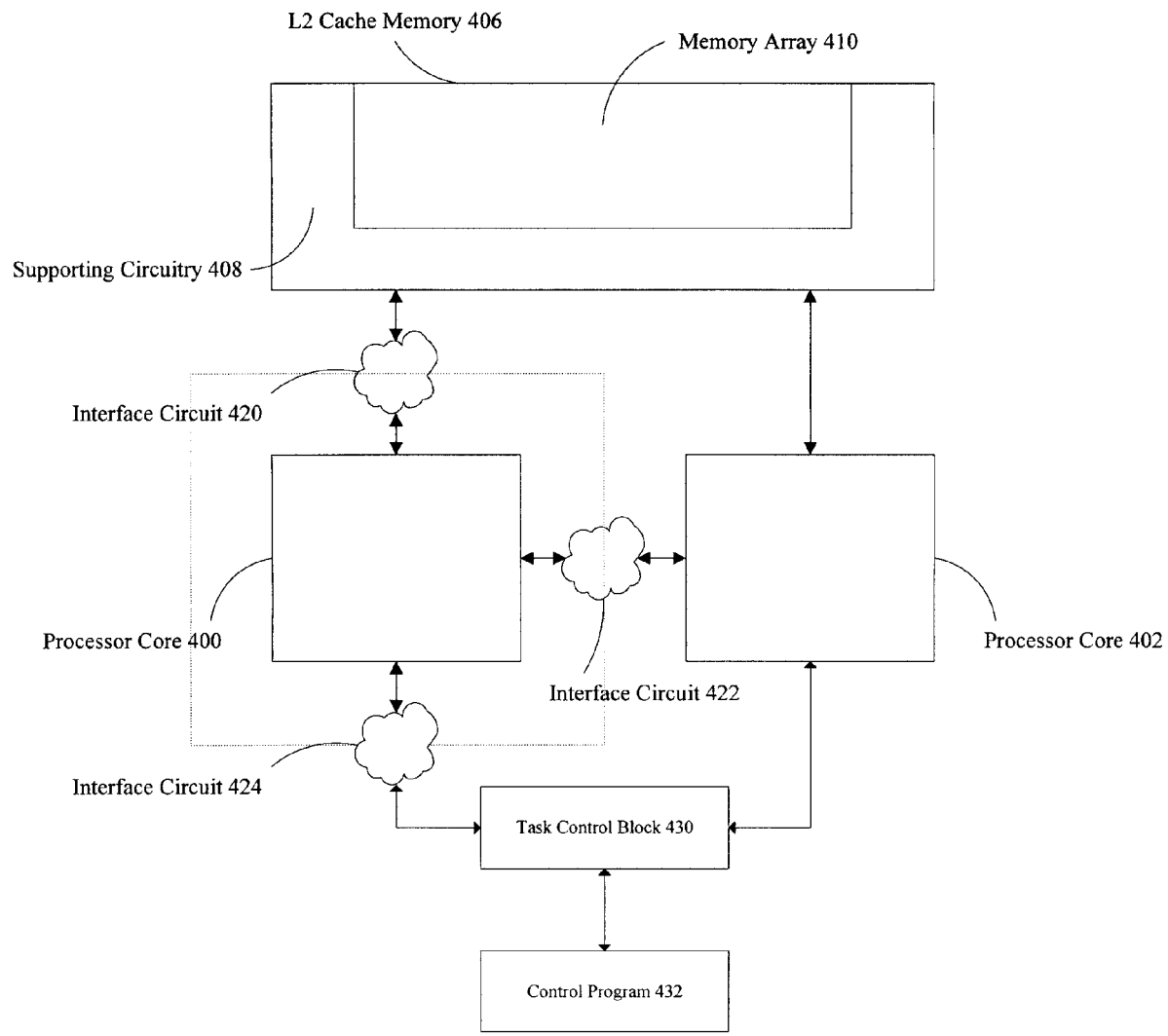
FIG. 4 is a block diagram of a two processor cores and a common L2 cache memory manufactured using two different gate oxide thicknesses.

FIG. 4 is a block diagram of an embodiment wherein a processor core 400 and a processor core 402 are coupled together. The processor core 400 is coupled to a common L2 cache memory 406. The processor core 402 is coupled to the common L2 cache memory 406. The common L2 cache 406 is further comprised of supporting circuitry 408 and a memory array 410. Interface circuits 420 and 422 may also be included to permit communication between the processor core 400, the processor core 402 and the common L2 cache memory 406 when these components are being operated at differing voltages or frequencies. The L2 cache memory 406 may also include level shifting circuitry to allow the memory array 410 to be operated at a different voltage than the supporting circuitry 408. A task control block 430 distributes tasks to the processor core 400 through interface circuit 424 and to processor core 402. The task control block 430 is responsive to a control program 432.

Interface circuits 420, 422 and 424 may be comprised of level shifting circuits, synchronization circuits or both. Level shifting and synchronization circuits allow multiple integrated circuits operating at different voltages and frequencies to communicate with each other. Synchronization allows circuits operating at different frequencies to communicate with each other, and is accomplished by use of a memory element to accumulate data from a first circuit and a control signal to indicate when the data is ready to be passed to a second circuit. Level shifting allows circuits operating at different voltages to communicate with each other, and is accomplished by use of a circuit that translates the logic high voltage of the first circuit into the appropriate logic high voltage of the second circuit. Both synchronization and level shifting are commonly bidirectional, but need not be.

In one embodiment, the processor core 400 may be manufactured using a thicker gate oxide while the processor core 402 and common L2 cache memory 406 may be manufactured using a thinner gate oxide. In this embodiment, tasks having strict performance requirements may be distributed to the faster processor core 402. Tasks having less stringent performance requirements may be distributed to the slower processor core 400. Manufacturing the common L2 cache memory 406 using the thinner gate oxide may provide higher performance during accesses to the common L2 cache memory 406 at the cost of higher leakage current.

In another embodiment the processor core 400 and the supporting circuitry 408 are manufactured using a thinner gate oxide. The processor core 402 and the memory array 410 are manufactured using a thicker gate oxide. This arrangement retains the performance advantages of a thinner gate oxide for the processor core 400 and for read and write operations into the L2 cache 406 while reducing power consumption in the memory array 410 and optimizing the processor core 402 to run low-priority tasks with reduced power consumption as compared to the processor core 400.

In another embodiment, the processor core 400 may be manufactured using a thinner gate oxide while the processor core 402 and common L2 cache memory 406 may be manufactured using a thicker gate oxide. In such an embodiment, tasks having strict performance requirements such as real-time processes may be distributed to the faster processor core 400. Tasks having less stringent performance requirements may be distributed to the slower processor core 402. Manufacturing the common L2 cache memory 406 using the thicker gate oxide can reduce leakage current in the memory array at the cost of read and write performance into the L2 cache memory 406.

The control program 432 provides tasks to the task control block 430. The task control block 430 distributes tasks to the processor core 400 and the processor core 402. In one exemplary embodiment, the task control block 430 receives tasks from the control program 432 and determines how those tasks should be distributed between the processor core 400 and the processor core 402. In another exemplary embodiment, the control program 432 is an operating system that provides tasks to the task control block 430 and provides control inputs to the task control block 430 to direct the distribution of tasks between the processor core 400 and the processor core 402.

These embodiments have presented specific combinations of processor cores and cache memories, as well as specifically defined voltage and frequency regions. However, those skilled in the art will recognize that a wide variety of combinations of cores and memories are possible. Additionally, those skilled in the art will recognize that voltage and frequency regions are not limited to those illustrated by these embodiments, but may be drawn anywhere depending on the required characteristics of the resulting integrated circuit.

Figure 5:
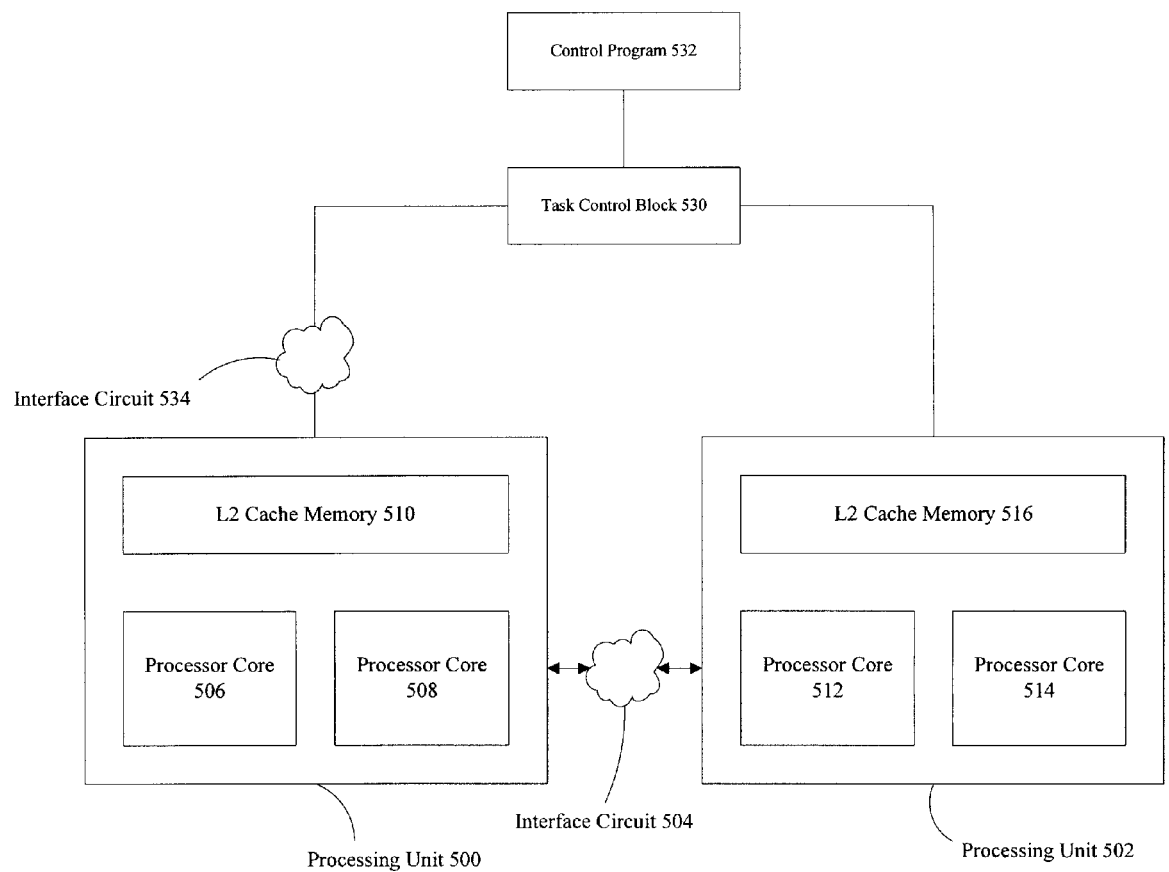
FIG. 5 is a block diagram of a set of two identical processing units manufactured using two different gate oxide thicknesses.

FIG. 5 is a block diagram of a third embodiment wherein a processing unit 500 is coupled to a processing unit 502 through interface circuitry 504. The processing unit 500 is made up of architecturally identical processor cores 506 and 508, which are coupled to each other and to a common L2 cache memory 510. The processing unit 500 is manufactured with a first gate oxide thickness. The processing unit 502 is made up of identical processor cores 512 and 514, which are coupled to each other and to a common L2 cache memory 516. The processing unit 502 is manufactured with a second gate oxide thickness. Those skilled in the art will realize that although in this embodiment both processing units 500 and 502 contain identical processor cores, other embodiments using heterogeneous processing cores or heterogeneous processing units are also feasible. The interface circuit 504 which couples the processing unit 500 and the processing unit 502 may be comprised of a system bus or of level shifting and synchronization circuitry which allows the processing unit 500 and the processing unit 502 to be operated at different voltages and frequencies. Those skilled in the art will realize that the interface circuit 504 could alternatively be integrated into the processing unit 500 and the processing unit 502.

A task control block 530 distributes tasks to the processing unit 500 through interface circuit 534 and to the processing unit 502. The task control block 530 is responsive to a control program 532. The control program 532 provides tasks to the task control block 530. The task control block 530 distributes tasks to the processing unit 500 and the processing unit 502. In one exemplary embodiment, the task control block 530 receives tasks from the control program 532 and determines how those tasks should be distributed between the processing unit 500 and the processing unit 502. In another exemplary embodiment, the control program 532 is an operating system that provides tasks to the task control block 530 and provides control inputs to the task control block 530 to direct the distribution of tasks between the processing unit 500 and the processing unit 502.

Operating the processing units 500 and 502 at different frequencies and voltages provides two architecturally identical processing units with different power and performance characteristics. For example, a manufacturing processing unit 500 using a thicker gate oxide may provide lower power consumption at low levels of performance while manufacturing processing unit 502 with a thinner gate oxide may provide lower power consumption at high levels of performance. Tasks may be allocated to either processing unit 500 or 502 based on the performance requirements of each task. Tasks with real-time completion requirements, for example, could be allocated to the faster processing unit while background system processes could be allocated to the slower processing unit. It would also be possible to dynamically allocate tasks. For example, if a task starts running on the slower processing unit but the operating system determines that the task is not going to complete quickly enough, the task may be moved to the faster processing unit.

While the teachings of the present disclosure are disclosed in the context of illustrative embodiments for processor cores coupled with memories, it will be recognized that a wide variety of implementations may be employed by persons of ordinary skill in the art consistent with the teachings herein and the claims which follow below.

What is claimed is:

1. A monolithic integrated circuit die, comprising:
   a first functional integrated circuit block manufactured solely with thickness of gate oxide layer equal to a first gate oxide thickness which advantageously uses the characteristics of the first gate oxide thickness in its function, wherein the first functional integrated circuit block comprises a first portion of a memory element;
   a second functional integrated circuit block manufactured solely with thickness of gate oxide layer equal to a second gate oxide thickness which advantageously uses the characteristics of the second gate oxide thickness in its function, wherein the second functional integrated circuit block comprises:
      a second portion of the memory element; and
      a processor core; and
   an I/O integrated circuit block manufactured with thickness of gate oxide layer equal to an I/O gate oxide thickness coupled to the first functional integrated circuit block and the second functional integrated circuit block.

2. The apparatus of claim 1 wherein a third functional integrated circuit block couples the first functional integrated circuit block and the second functional integrated circuit block.

3. The apparatus of claim 2 wherein the third functional integrated circuit block includes a level shifting circuit for translating between differing voltages in the first functional integrated circuit block and the second functional integrated circuit block.

4. The apparatus of claim 2 wherein the third functional integrated circuit block includes a synchronization circuit for synchronizing communication between the first functional integrated circuit block and the second functional integrated circuit block.

5. The apparatus of claim 2 wherein the third functional integrated circuit block comprises a system bus.

6. A method of manufacturing a monolithic integrated circuit die, comprising:
   manufacturing a first functional integrated circuit block solely with thickness of gate oxide layer equal to a first gate oxide thickness which advantageously uses the characteristics of the first gate oxide thickness in its function, wherein the first functional integrated circuit block comprises a first portion of a memory element;
   manufacturing a second functional integrated circuit block solely with thickness of gate oxide layer equal to a second gate oxide thickness which advantageously uses the characteristics of the second gate oxide thickness in its function, wherein the second functional integrated circuit block comprises:
      a second portion of the memory element; and
      a processor core; and
   manufacturing an I/O integrated circuit block with thickness of gate oxide layer equal to an I/O gate oxide thickness coupled to the first functional integrated circuit block and the second functional integrated circuit block.

7. The method of claim 6 wherein a third functional integrated circuit block couples the first functional integrated circuit block and the second functional integrated circuit block.

8. The method of claim 7 wherein the third functional integrated circuit block includes a level shifting circuit for translating between differing voltages in the first functional integrated circuit block and the second functional integrated circuit block.

9. The method of claim 7 wherein the third functional integrated circuit block includes a synchronization circuit for synchronizing communication between the first functional integrated circuit block and the second functional integrated circuit block.

10. The method of claim 7 wherein the third functional integrated circuit block comprises a system bus.

11. A monolithic integrated circuit die, comprising:
    a first functional integrated circuit means manufactured solely with thickness of gate oxide layer equal to a first gate oxide thickness which advantageously uses the characteristics of the first gate oxide thickness in its function, wherein the first functional integrated circuit block comprises a first portion of a means for storing data;
    a second functional integrated circuit means manufactured solely with thickness of gate oxide layer equal to a second gate oxide thickness which advantageously uses the characteristics of the second gate oxide thickness in its function, wherein the second functional integrated circuit block comprises:
       a second portion of the means for storing data; and
       means for processing; and
    an I/O integrated circuit block manufactured with thickness of gate oxide layer equal to an I/O gate oxide thickness coupled to the first functional integrated circuit means and the second functional integrated circuit means.

* * * * *